United States Patent
Ng et al.

(10) Patent No.: US 7,948,095 B2
(45) Date of Patent: May 24, 2011

(54) SEMICONDUCTOR PACKAGE AND METHOD OF MAKING THE SAME

(75) Inventors: Catherine Bee Liang Ng, Singapore (SG); Chin Hock Toh, Singapore (SG); Anthony Yi-Sheng Sun, Singapore (SG)

(73) Assignee: United Test and Assembly Center Ltd., Singapore (SG)

( * ) Notice: Subject to any disclaimer, the term of this patent is extended or adjusted under 35 U.S.C. 154(b) by 225 days.

(21) Appl. No.: 12/369,429

(22) Filed: Feb. 11, 2009

(65) Prior Publication Data
US 2009/0200662 A1    Aug. 13, 2009

Related U.S. Application Data

(60) Provisional application No. 61/027,843, filed on Feb. 12, 2008.

(51) Int. Cl.
*H01L 23/48* (2006.01)
*H01L 23/52* (2006.01)

(52) U.S. Cl. ........ 257/790; 257/777; 257/686; 257/774; 257/E23.145

(58) Field of Classification Search ................ 257/787, 257/774, 777, 686, E23.145
See application file for complete search history.

(56) References Cited

U.S. PATENT DOCUMENTS

| | | | | |
|---|---|---|---|---|
| 6,762,488 B2* | 7/2004 | Maeda et al. | ................ | 257/686 |
| 7,491,582 B2* | 2/2009 | Yokoyama et al. | ........... | 438/109 |
| 7,498,675 B2* | 3/2009 | Farnworth et al. | ............ | 257/723 |
| 7,537,959 B2* | 5/2009 | Lee et al. | ...................... | 438/106 |
| 7,663,232 B2* | 2/2010 | Kinsley | ......................... | 257/726 |
| 7,667,313 B2* | 2/2010 | Kawabata et al. | ........... | 257/686 |
| 2004/0188819 A1* | 9/2004 | Farnworth et al. | ........... | 257/686 |
| 2006/0097402 A1* | 5/2006 | Pu et al. | ........................ | 257/777 |
| 2007/0218678 A1* | 9/2007 | Suh et al. | ...................... | 438/622 |
| 2008/0036082 A1* | 2/2008 | Eun | ................................ | 257/737 |
| 2009/0001543 A1* | 1/2009 | Chung | .......................... | 257/686 |
| 2010/0090326 A1* | 4/2010 | Baek et al. | ..................... | 257/686 |

* cited by examiner

*Primary Examiner* — Nitin Parekh
(74) *Attorney, Agent, or Firm* — Sughrue Mion, PLLC

(57) ABSTRACT

The present invention relates to semiconductor devices comprising two or more dies stacked vertically on top of one another, and methods of making the semiconductor devices. The methods may comprise a combination of wafer-level through silicon interconnect fabrication and wafer-level assembly processes.

3 Claims, 17 Drawing Sheets

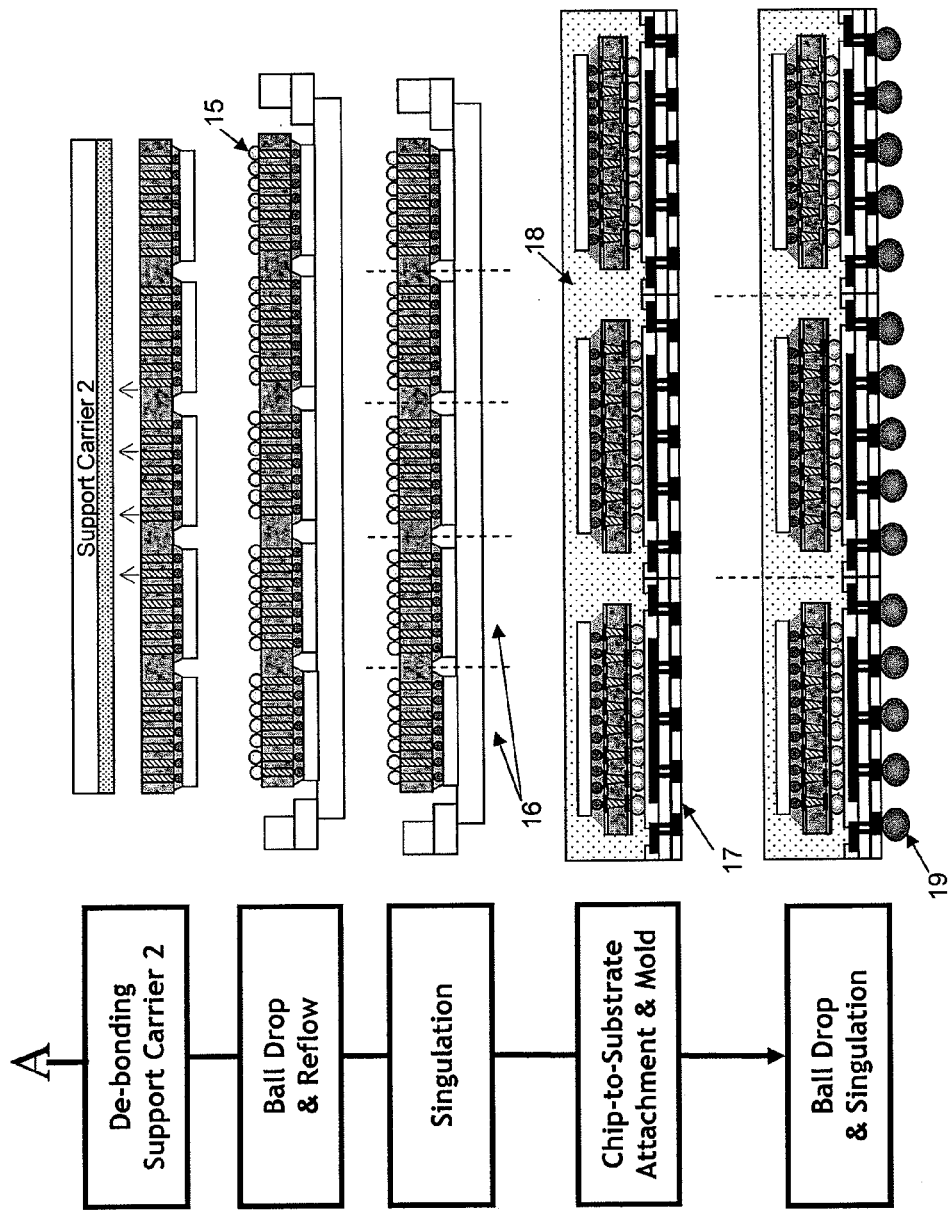
Figure 1(b)(ii)
Prior Art

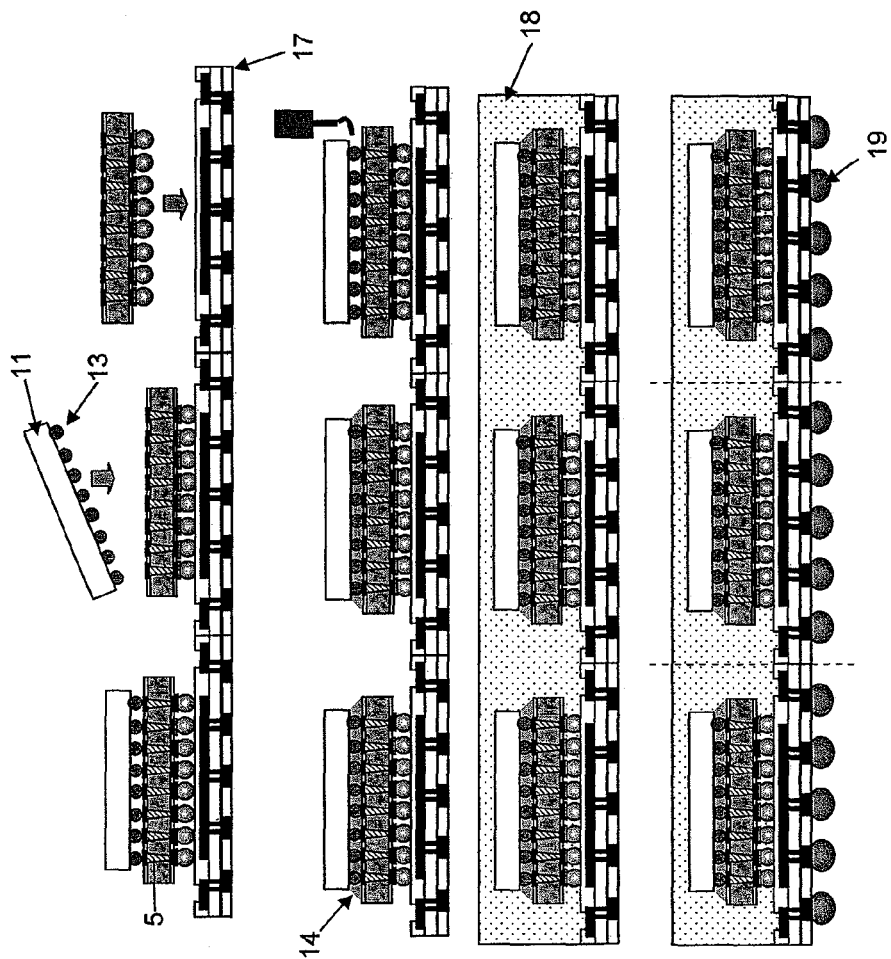
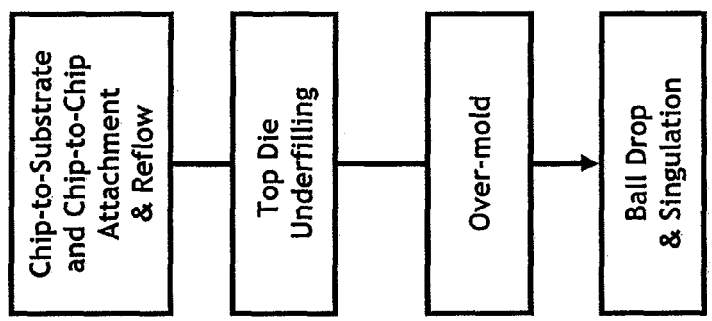
Figure 1(c) (ii)
Prior Art

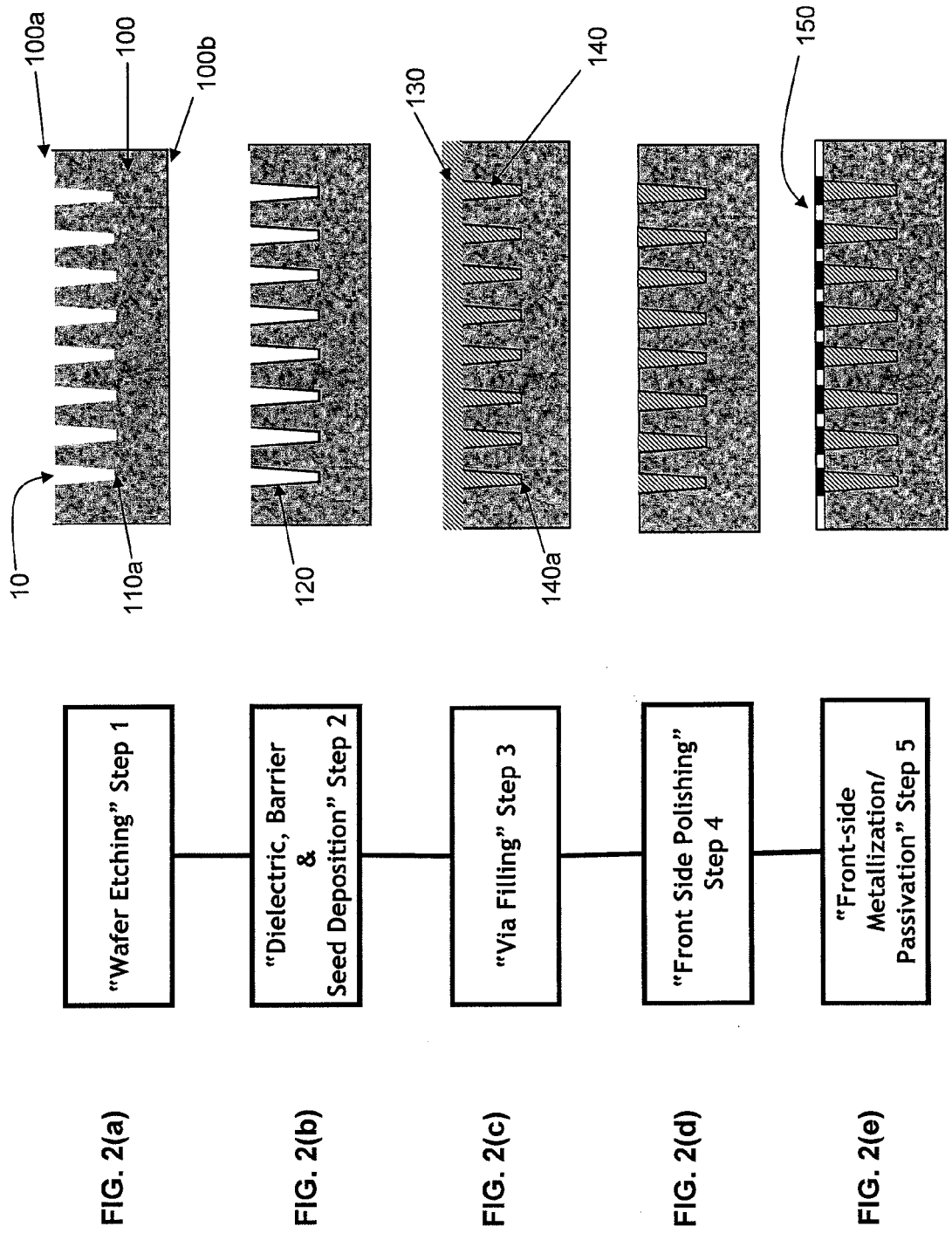

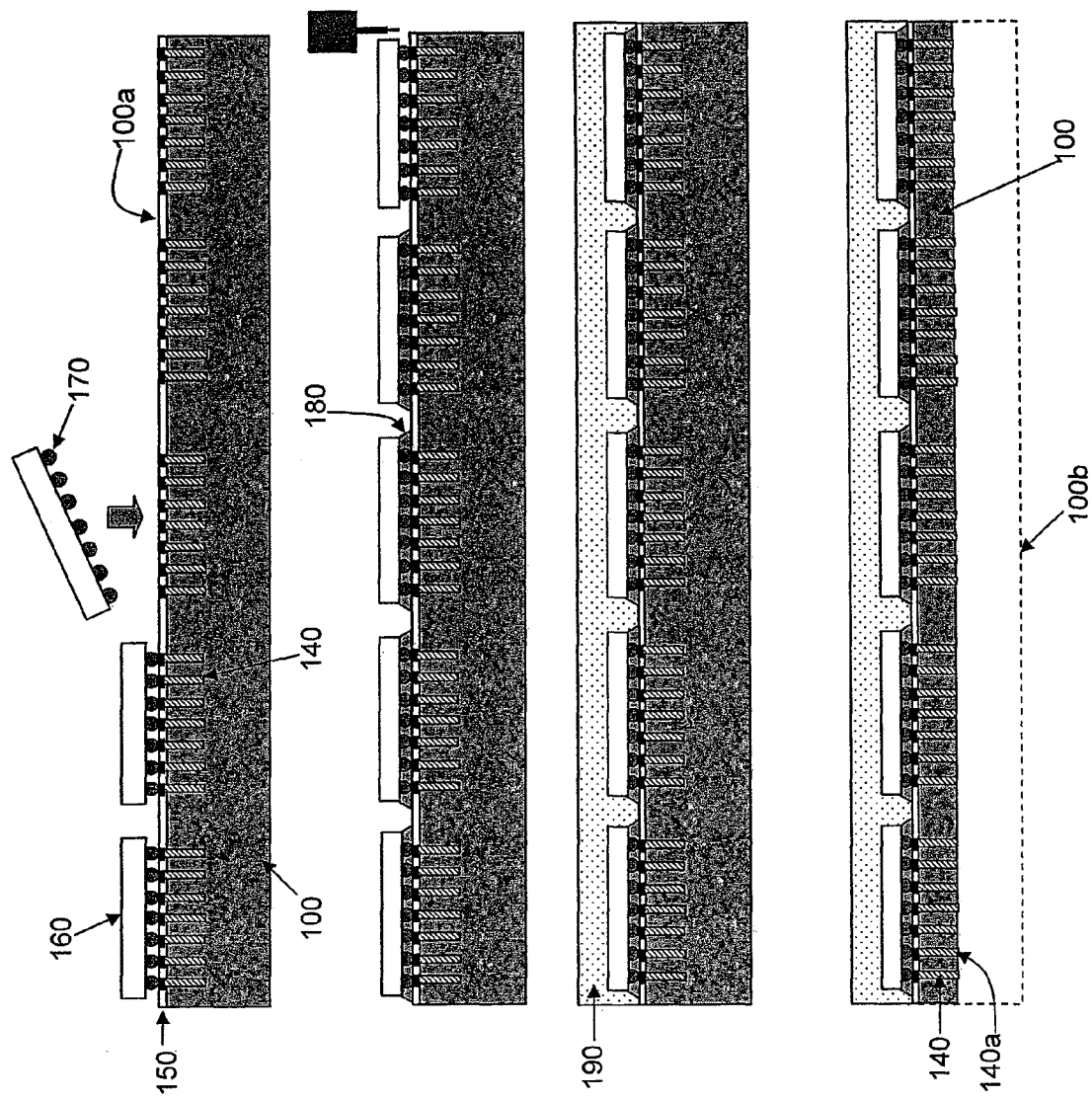

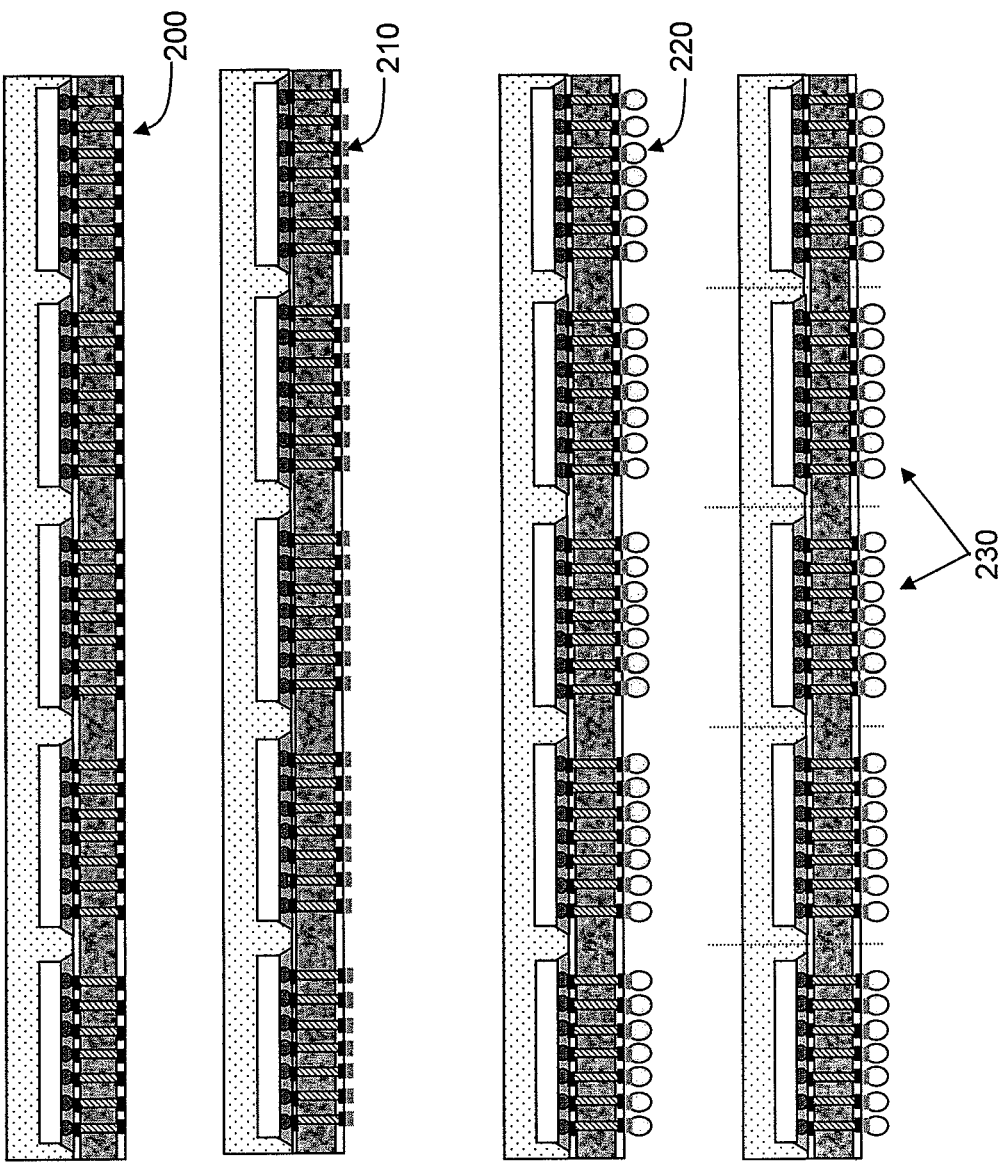

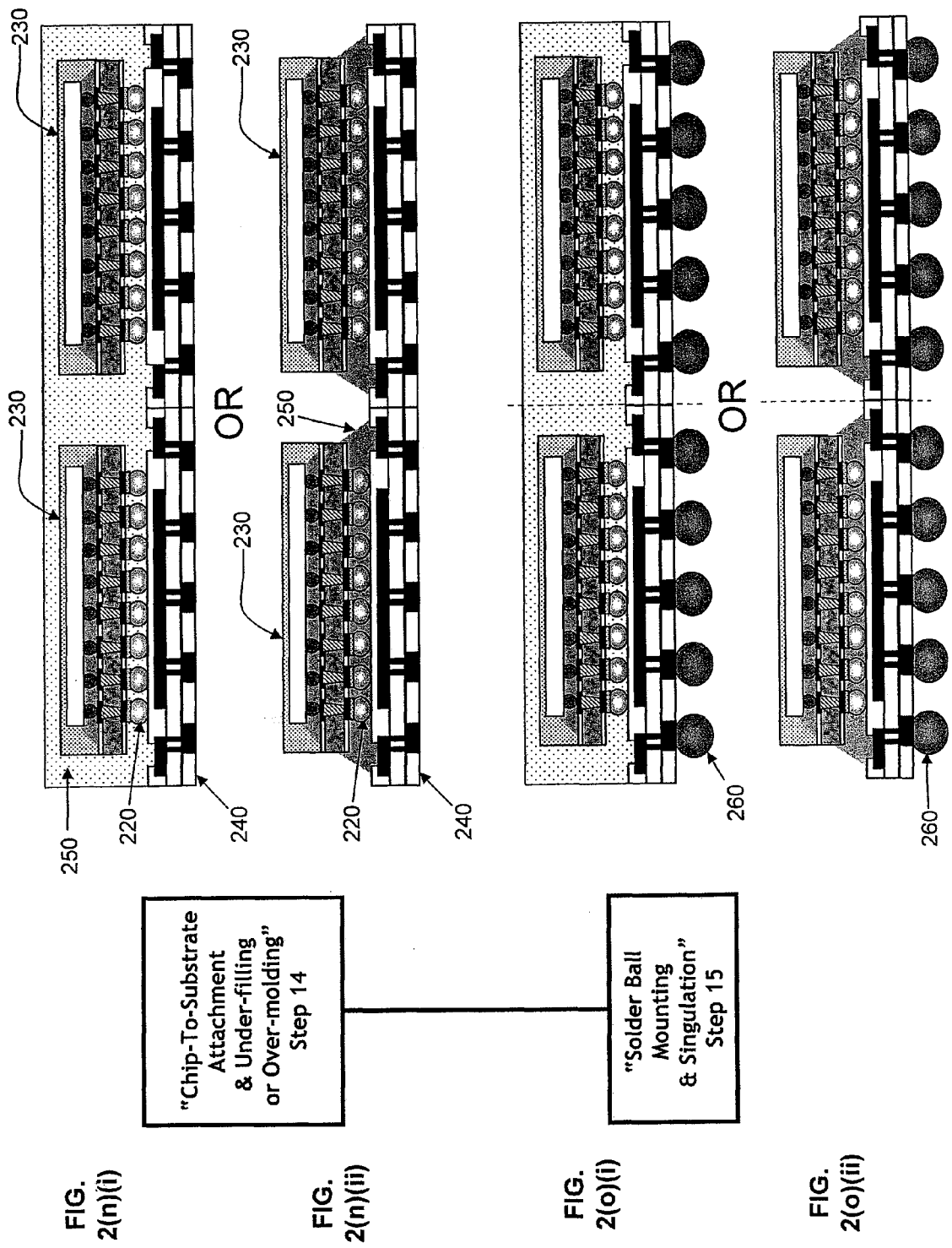

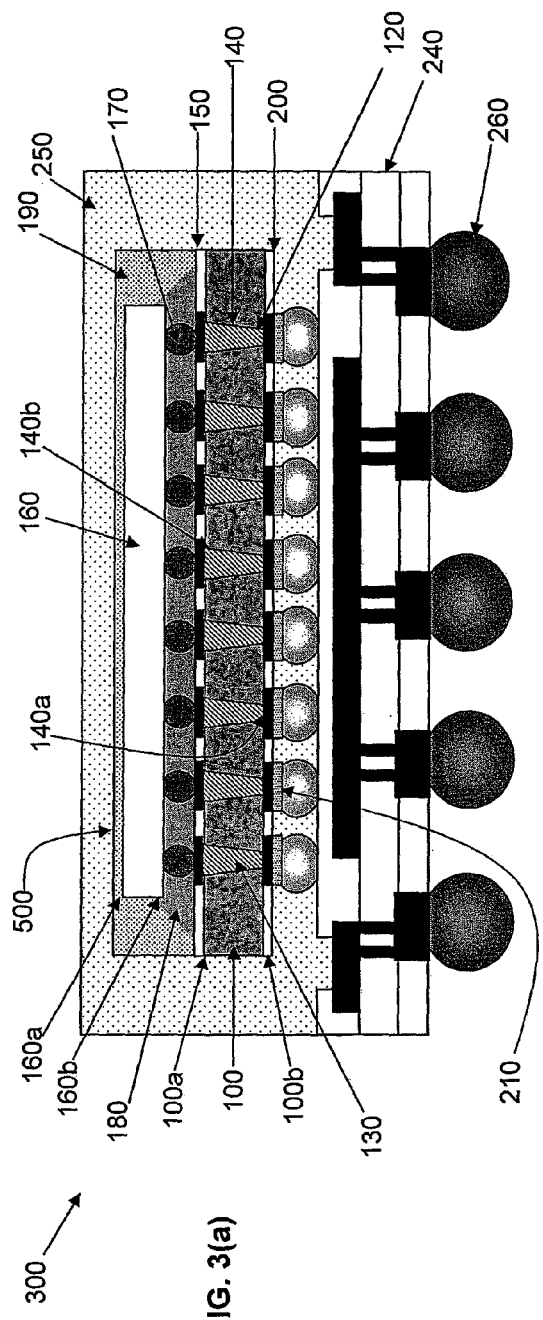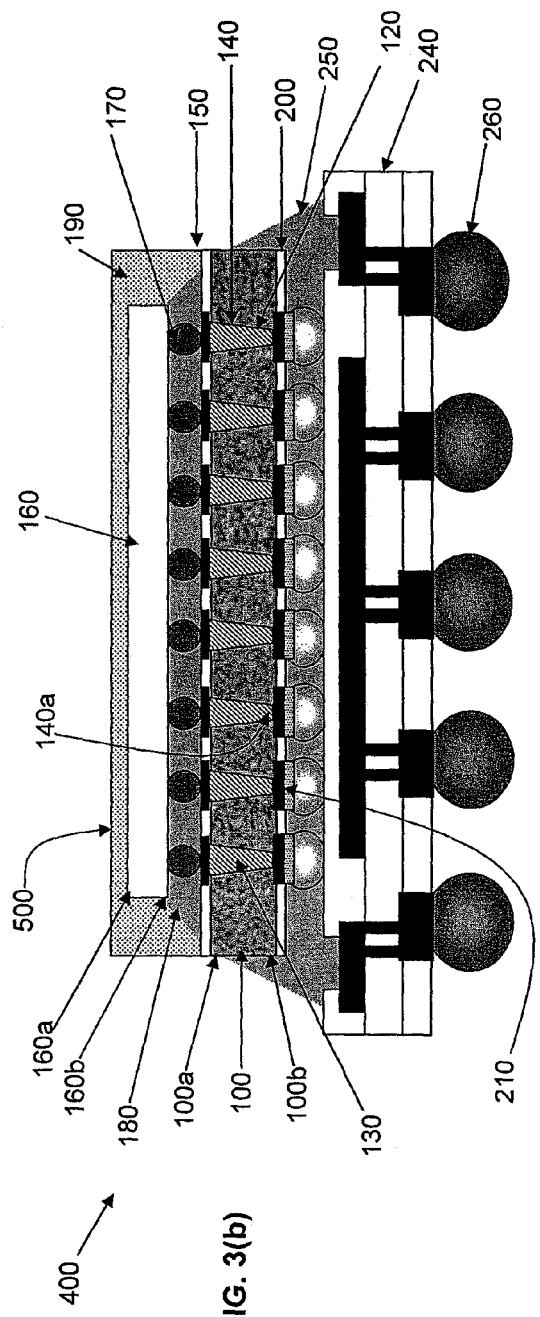
FIG. 3(a)
FIG. 3(b)

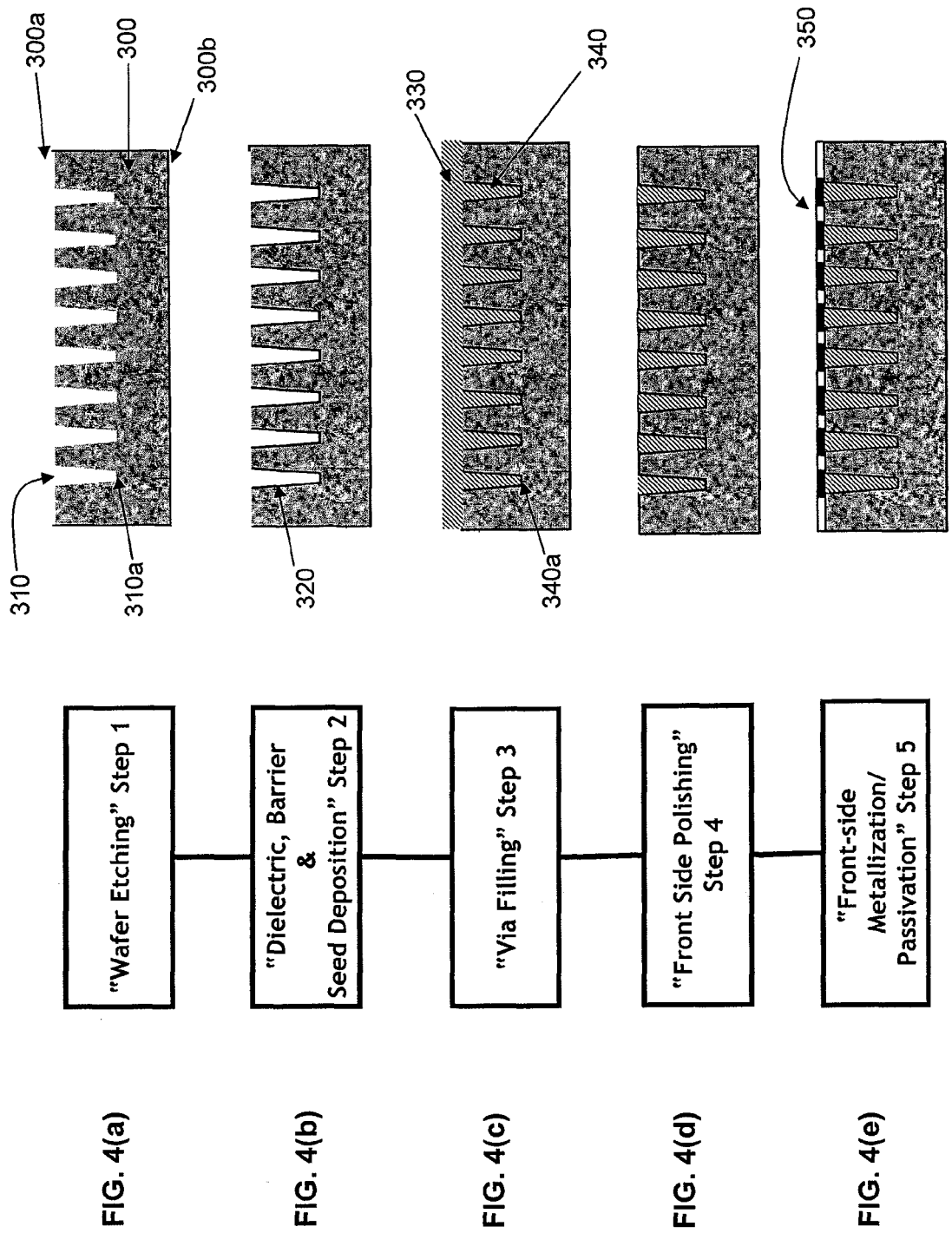

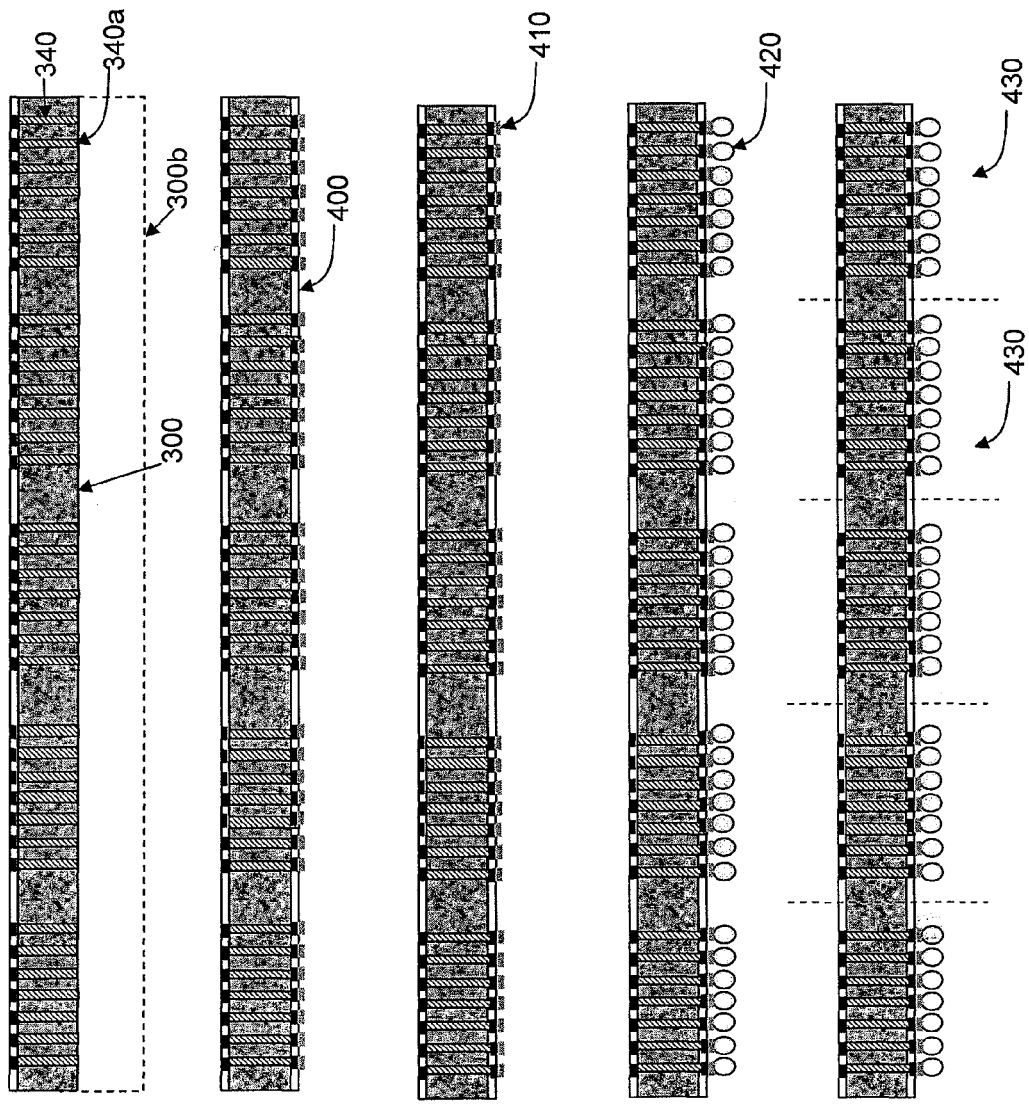
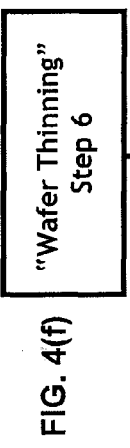
FIG. 4(f)
FIG. 4(g)
FIG. 4(h)
FIG. 4(i)
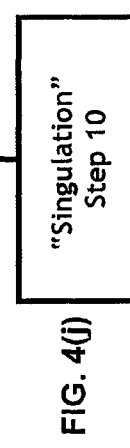
FIG. 4(j)

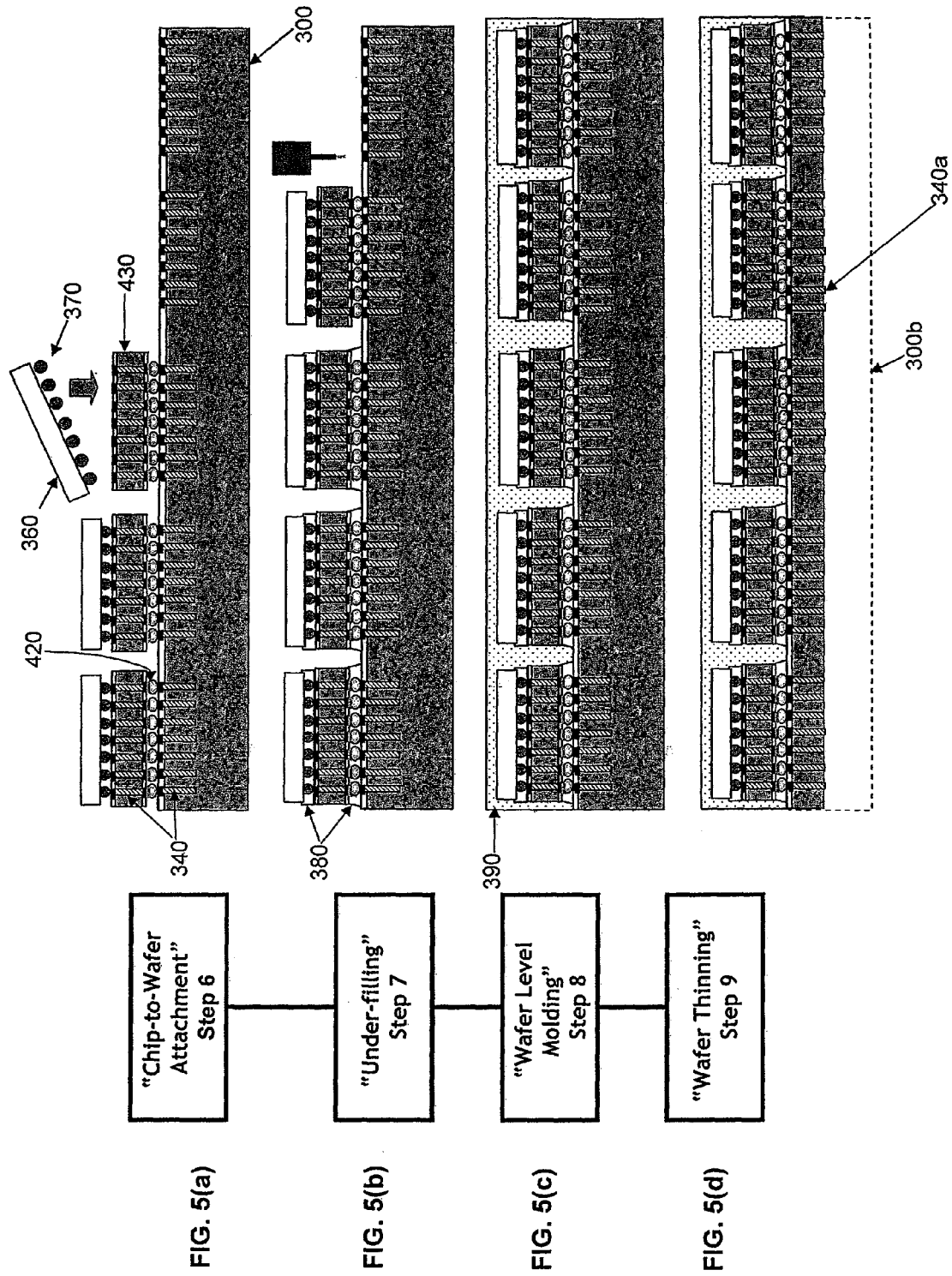

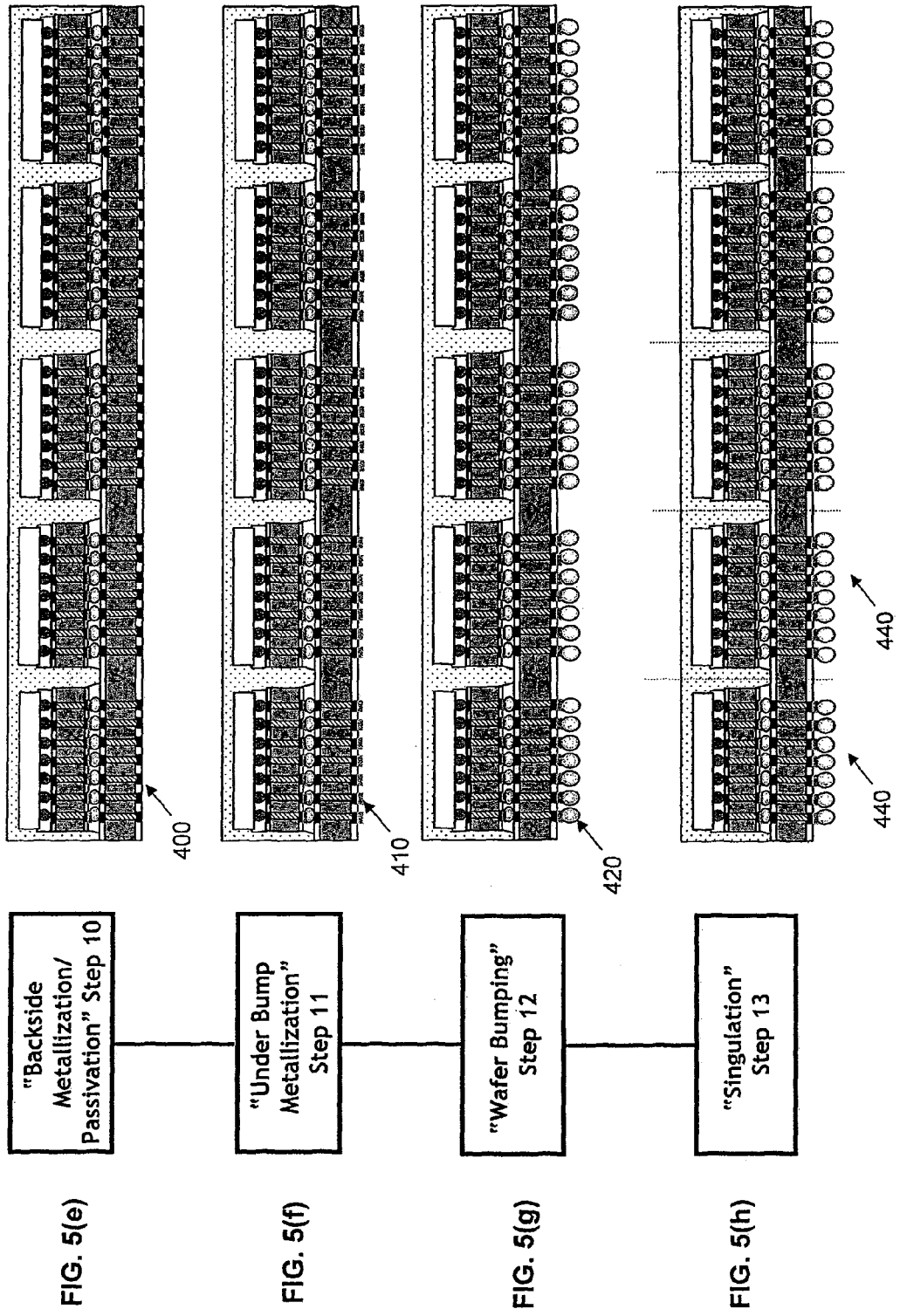

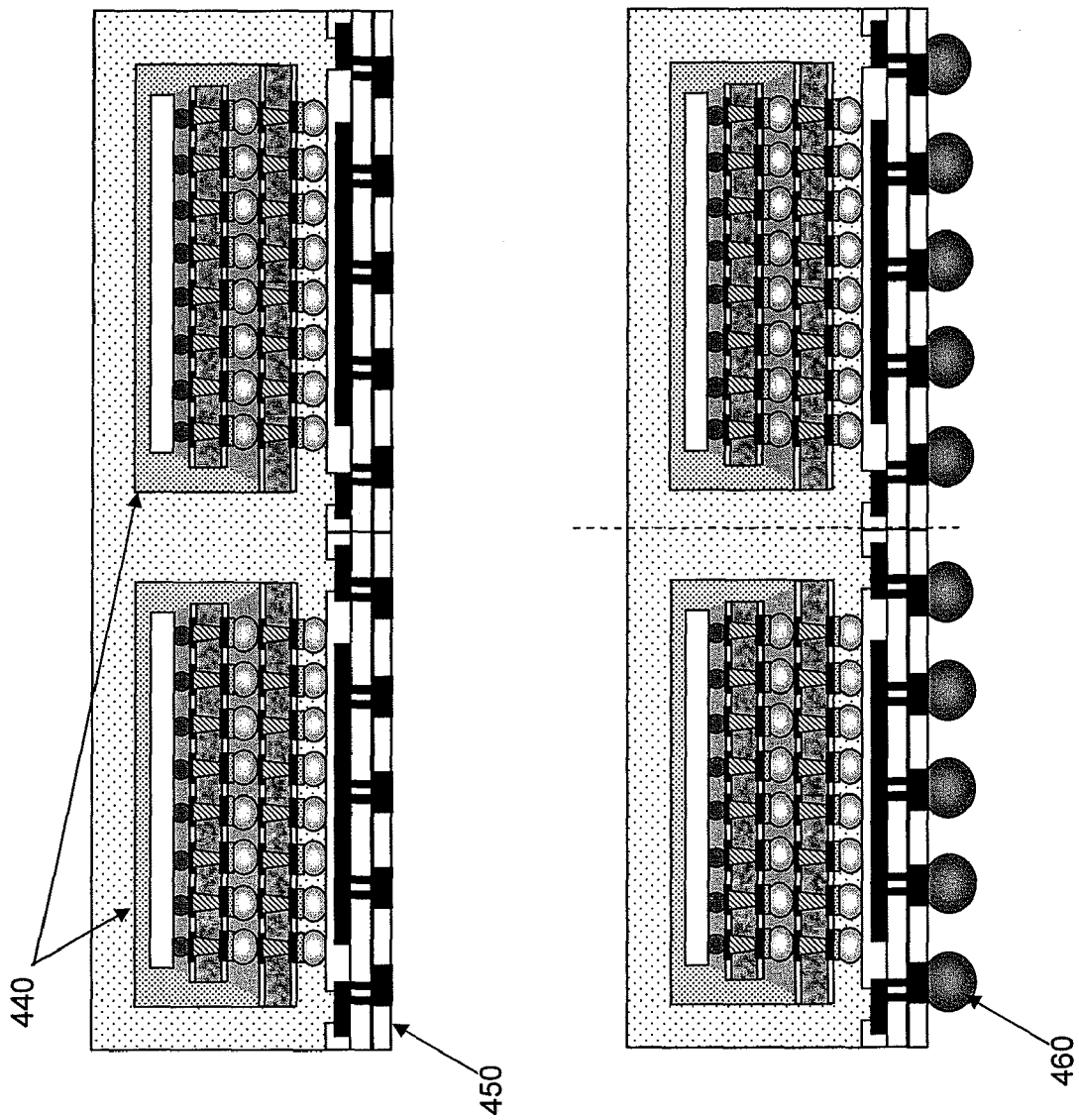
FIG. 5(i) "Chip-To-Substrate Attachment & Under-filling or Over-molding" Step 14
FIG. 5(j) "Solder Ball Mounting & Singulation" Step 15

SEMICONDUCTOR PACKAGE AND METHOD OF MAKING THE SAME

CROSS-REFERENCE TO RELATED PATENT APPLICATION

The present application claims priority from U.S. Provisional Application No. 61/027,843, which was filed on Feb. 12, 2008, and is incorporated herein by reference in its entirety.

BACKGROUND OF THE INVENTION

1. Field of the Invention

The present invention relates to semiconductor devices comprising two or more dies stacked vertically on top of one another, and methods of making the semiconductor devices.

2. Description of the Related Art

Vertical stacking of multiple flip chips in a stacked die package requires wafers to be processed with through silicon interconnects to enable face-to-back (F2B) flip chip bonding. The wafers are typically thinned or back-ground during the process of forming the interconnects, and therefore known processes for stacking the thinned wafers require a support carrier that is temporarily bonded to the wafers during handling and equipment processing to prevent warping. More particularly, the support carrier can improve the rigidity of the thinned wafers in the wafer-level through silicon interconnect fabrication process and wafer-level assembly process. However, the process of bonding the support carrier to the wafer involves additional process and material developments, additional equipment investment, increased packaging cost and additional process steps directed to the bonding of the support carrier to and de-bonding of the support carrier from the wafer. Exemplary known processes for forming the stacked die package will be illustrated with reference to FIGS. 1(a) to 1(d).

FIG. 1(a) shows a known process of forming a thinned wafer that is temporarily bonded to a first support carrier. The process begins with a wafer 1 that is etched at its front surface 1a to form vias 2 therein. The vias 2 extend from the front surface 1a of the wafer 1 and partially into the wafer 1. The front surface 1a of the wafer 1 and the vias 2 are plated with a dielectric layer, a barrier metal layer and a seed layer (collectively referred to as numeral 3). The plated vias 2 are then filled with a metallic material 4 such as copper (Cu) to form through silicon interconnects 5. Thereafter, metallization and passivation layers (collectively referred to as numeral 6) are formed on the front surface 1a of the wafer 1. To prepare the wafer 1 for thinning or back-grinding, a first support carrier 7 is bonded to the front surface 1a of the wafer 1 using a bonding material 7a. The thinning of the wafer 1 occurs at its rear surface 1b, opposite to the front surface 1a. The wafer 1 is back-ground until the through silicon interconnects 5 are exposed at their rear end portions 5a. Metallization and passivation layers (collectively referred as numeral 8) are formed at the rear surface 1b of the thinned wafer 1, followed by forming of under bump metallization (UBM) pads 9. Solder bumps 10 are formed on the under bump metallization pads 9.

FIGS. 1(b)(i) and 1(b)(ii) show a known process of stacking flip chips 11 onto the thinned wafer with UBM pads 9 from FIG. 1(a). To prepare the front surface 1a of the thinned wafer for stacking, a second support carrier 12 is temporarily bonded to the rear surface 1b of the wafer using bonding material 12a followed by removal (de-bonding) of the first support carrier 7 from the front surface 1a. The flip chips 11 are stacked over the front surface 1a of wafer 1 such that solder bumps 13 of the flip chips 11 are aligned with the through silicon interconnects 5 of the wafer 1. The flip chips 11 are then under-filled with a resin 14 and the second support carrier 12 removed. Solder bumps 15 are then provided on the rear surface 1b of the wafer 1. The wafer 1 with flip chips 11 stacked thereon is singulated into individual units 16 which are mounted onto a substrate 17. The assembly is over-molded with molding material 18 and mounted with solder balls 19 before being singulated into individual packages.

FIGS. 1(c)(i) and 1(c)(ii) show an alternate known process of stacking flip chips 11 onto the thinned wafer 1 with UBM pads 9 and solder bumps 10 from FIG. 1(a). The first support carrier 7 is removed from the thinned wafer 1. The wafer 1 is singulated into individual dies which are mounted onto a substrate 17. Flip chips 11 are stacked on the front surface of the dies such that solder bumps 13 of the flip chips 11 are aligned with the through silicon interconnects 5 of the dies. The flip chips 11 are then under-filled with resin 14 and the entire assembly over-molded with molding material 18. Solder balls 19 are formed on the underside of the substrate 17 followed by singulation into individual packages.

FIG. 1(d) shows a semiconductor package resulting from the processes described by FIGS. 1(a) and 1(b), or 1(a) and 1(c).

The known processes of forming the stacked die package involve the use of one or more support carriers which can result in the disadvantages as highlighted above. There is therefore a need to provide a process that can at least reduce usage or avoid the use of the support carriers.

SUMMARY OF THE INVENTION

The present invention provides semiconductor devices comprising two or more dies stacked vertically on top of one another, and methods of making the semiconductor devices.

Unlike the known processes as described above, the wafers need not be fully processed in order to proceed with the die stacking process. That is, the wafer need not undergo both the through silicon interconnect formation and the wafer thinning processes before other chips can be stacked onto it. Instead, stacking of the chips may be accomplished on semi-processed wafers which would have completed the through silicon interconnect fabrication process but not the wafer thinning process. The un-thinned wafer provides support for the assembly as the chips are stacked onto it and as the stacked structure is molded.

After molding, the thinning of the wafer occurs. The mold material provides support to the assembly during thinning and continues to support the assembly for subsequent processes such as backside metallization/passivation, under bump metallization pad formation, wafer bumping, singulation, etc. The process of the present invention can, thus, reduce or eliminate reliance on the use of temporary bonded support carriers, which is important for thin wafer handling and equipment processing in the known process as described above.

According to an aspect of the present invention, there is provided a method for forming a stacked die package, the method comprising: attaching one or more semiconductor chips to a front side of a wafer; over-molding the semiconductor chips with a molding material; and thinning the back side of the wafer; wherein the over-molding is performed prior to the thinning.

The method may be such that the molding material provides support to the wafer during the thinning; during the thinning, the wafer is not coupled to a support carrier which is de-couplable from the wafer; or the molding material comprises an epoxy resin or a polymer-based encapsulation material.

According to a further aspect of the present invention, there is provided a stacked die package formed according to the above-described method.

According to a further aspect of the present invention, there is provided a method for forming a stacked die package, the method comprising: attaching one or more semiconductor chips to a front side of a wafer; over-molding the semiconductor chips with a molding material; and singulating the wafer into one or more singulated units, each unit comprising at least one of the semiconductor chips; wherein the over-molding is performed prior to the singulating the wafer.

The method may be such that the molding material provides support to the wafer during the singulating; during the singulating, the wafer is not coupled to a support carrier which is de-couplable from the wafer; or the molding material comprises an epoxy resin or a polymer-based encapsulation material.

According to a further aspect of the present invention, there is provided a stacked die package formed according to the above-described method.

According to a further aspect of the present invention, there is provided a method for forming a stacked die package, the method comprising: grinding the back surface of a wafer to expose through silicon interconnects; wherein a front side of the wafer is over-molded with a molding material which encapsulates one or more semiconductor chips and provides support to the wafer during the grinding.

According to a further aspect of the present invention, there is provided a method for forming a stacked die package comprising: etching a wafer to create one or more vias in the wafer, the vias extending from a front surface of the wafer toward a back surface of the wafer, the vias terminating within the wafer; plating the wafer with a dielectric layer; plating the dielectric layer with a barrier metal layer; plating the barrier metal layer with a seed layer; filling the vias with a metallic material; polishing the front side of the wafer; performing metallization and passivation on the front surface of the wafer; coupling one or more semiconductor chips to the front surface of the wafer such that conductive portions of the semiconductor chips align with the vias; under-filling gaps between the semiconductor chips and the front surface of the wafer with an under-fill material; covering the semiconductor chips and the front surface of the wafer with a molding material; grinding the back surface of the wafer to expose the vias from the back surface of the wafer; performing metallization and passivation on the back surface of the wafer; forming under bump metallization pads on metallized portions of the back surface of the wafer; coupling conductive bumps to the under bump metallization pads; singulating the wafer into singulated units, each singulated unit comprising at least one semiconductor chip and a portion of the wafer; chip to substrate attachment coupling the singulated units to a front surface of a substrate; performing at least one of under-filling gaps between the singulated units and the front surface of the substrate with an under-fill material, and over-molding the singulated units and the front surface of the substrate with a molding material; mounting electrical connections to the back surface of the substrate; singulating the substrate into semiconductor packages, each semiconductor package comprising at least one singulated unit and a portion of the substrate.

The method may further comprise stacking one or more intermediate wafers between the semiconductor chip and the wafer.

According to a further aspect of the present invention, there is provided a semiconductor package comprising: a substrate; a first die having a front side, a back side, and a plurality of through silicon interconnects, the first die being stacked onto the substrate; and a second die having a front side, a back side, and a first plurality of conductive bumps formed at the back side of the second die, the second die being stacked onto the first die and under-filled such that the first plurality of conductive bumps communicate with the through silicon interconnects; wherein a first mold material encapsulates the second die and the front side of the first die; and a second mold material encapsulates the first die, the second die, and a plurality of external electrical connections.

In the semiconductor package, each of the through silicon interconnects may further comprise: an end portion at the back side of the first die and a top portion at the front side of the first die; a dielectric layer formed along internal walls of the through silicon interconnect; a barrier metal layer formed over the dielectric layer; a seed layer formed over the barrier metal layer; and a metallic material filling space within the internal walls of the through silicon interconnect.

The semiconductor package may further comprise: a metallic layer and a passivation layer formed on the front side of the first die so as to be non-overlapping; a metallic layer and a passivation layer formed on the back side of the first die so as to be non-overlapping; a plurality of UBM pads formed on the metallic layer on the back side of the first die; and a second plurality of conductive bumps formed on the UBM pads.

BRIEF DESCRIPTION OF THE DRAWINGS

The above and other features of the present invention will become more apparent by describing in detail exemplary embodiments thereof with reference to the attached drawings in which:

FIGS. 2(a)-2(o) show a process flow diagram for making a semiconductor device according to an exemplary embodiment of the invention.

FIG. 3(a) shows a semiconductor device according to an exemplary embodiment of the invention.

FIG. 3(b) shows a semiconductor device according to an alternative exemplary embodiment of the invention.

FIGS. 4(a)-4(j) show a process flow diagram for making an intermediate die.

FIGS. 5(a)-5(j) show a process flow diagram for making a semiconductor device according to another exemplary embodiment of the invention.

DETAILED DESCRIPTION OF THE EXEMPLARY EMBODIMENTS

Figure 1A:
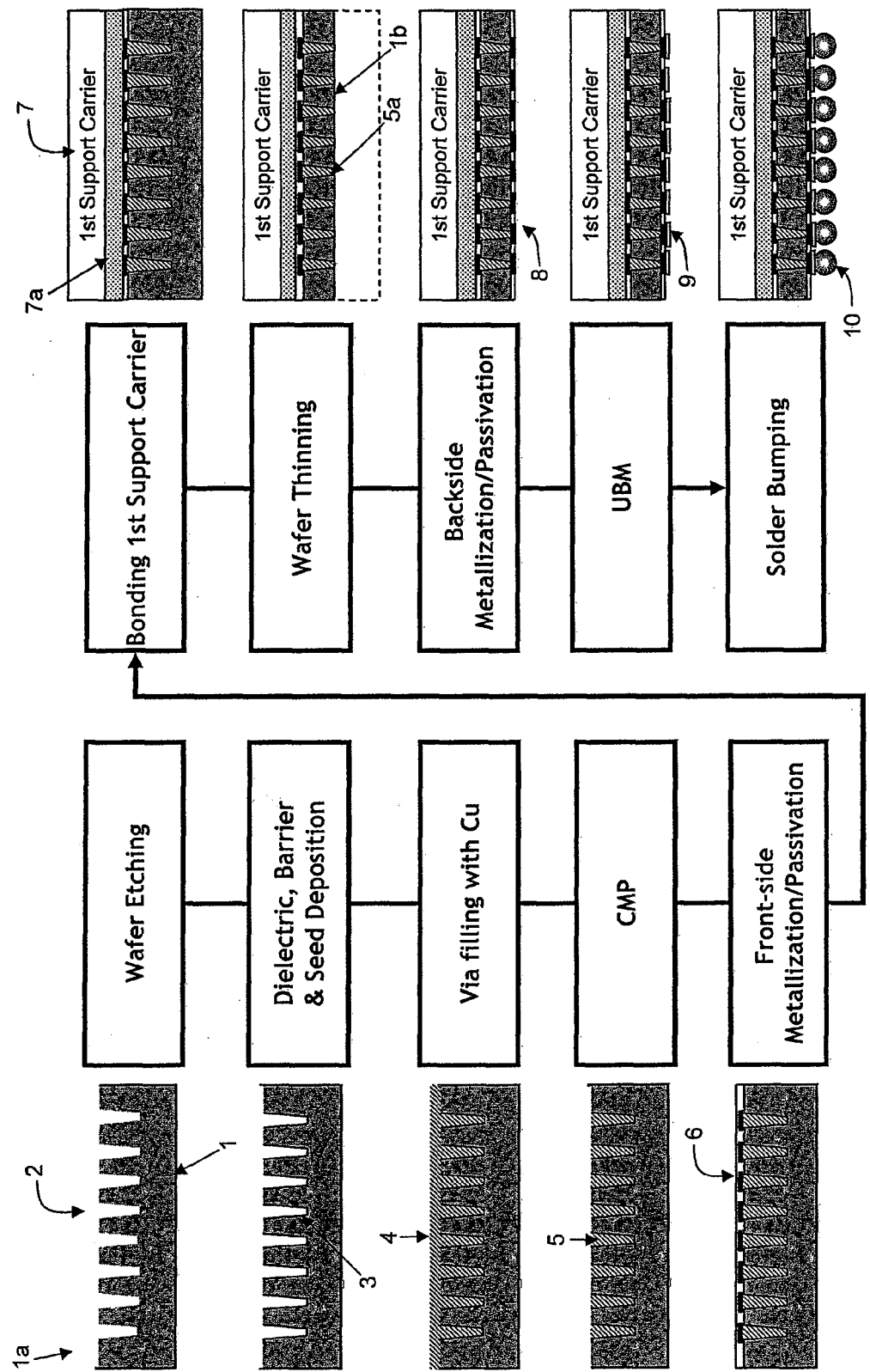
FIG. 1(a) illustrates a known process of forming a thinned wafer that is bonded to a first support carrier.
Figure 1B:
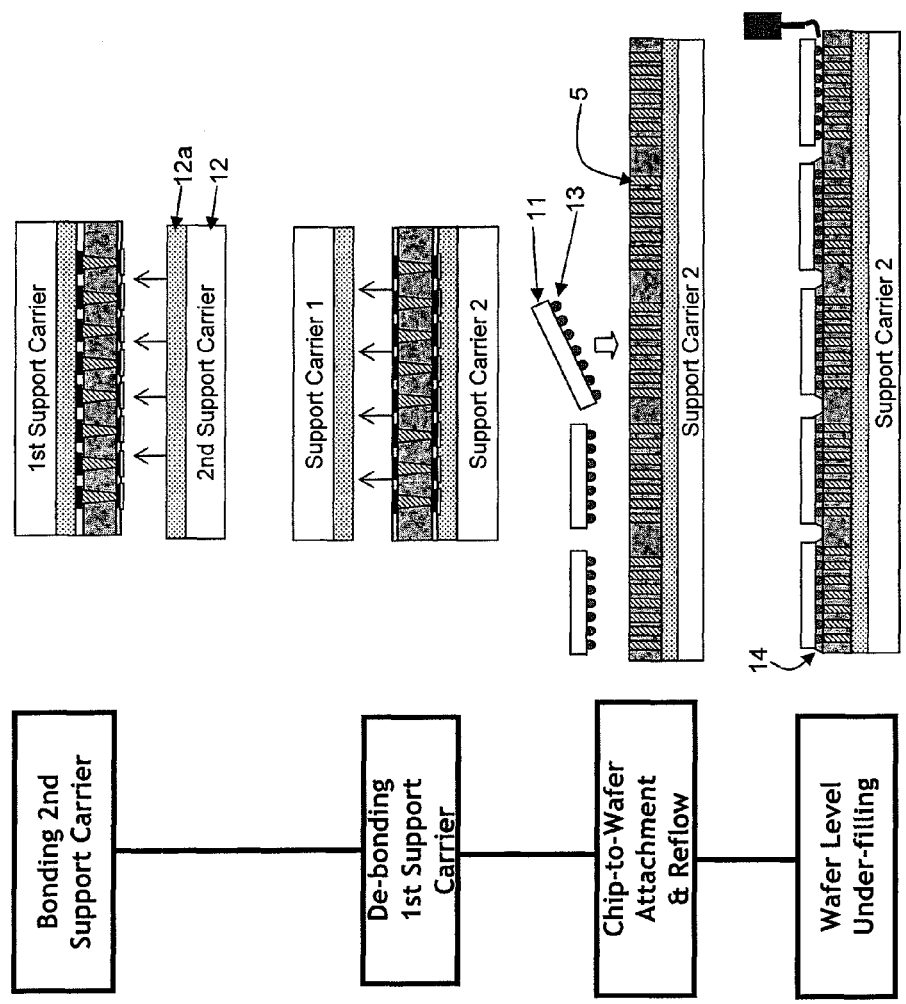
FIGS. 1(b)(i) and 1(b)(ii) illustrate a known process of stacking flip chips onto the thinned wafer with UBM pads from FIG. 1(a).

The present invention will now be described more fully with reference to the accompanying drawings, in which exemplary embodiments of the invention are shown.

Stacked Package Having Two Dies

A process of making a semiconductor device is described with reference to the process flow diagram of FIGS. 2(a) to 2(o).

The process comprises the steps 1 to 15 which will be described in detail in the paragraphs below.

"Wafer Etching" step 1, FIG. 2(a):—A wafer 100 is etched to create one or more vias 110 in the wafer 100. The wafer can be an inactive silicon wafer without active circuitry embedded therein, or an active silicon wafer with active circuitry embedded therein. Where the wafer is an active wafer, it would result in a functional die in the resulting stacked die package. Where the wafer is an inactive wafer, it would function as an interposer for distributing finer pitch connections of the chip stacked above to larger pitch connections of the substrate below. The etching can be achieved by patterning a mask (not shown) onto a front side 100a of the wafer 100. The mask exposes areas of the front side 100a of the wafer 100 where the vias 110 are to be formed and covers the remaining areas. Etching, for example, deep reactive-ion etching (DRIE), is then performed to form the vias 110 in the wafer 100. The mask is removed after the etching is completed. Other etching techniques include but are not limited to laser drilling. The vias 110 extend from the front surface 100a of the wafer 100 toward a rear surface 100b such that their end portions 110a reside partially in the wafer 100.

"Dielectric, Barrier & Seed Deposition" step 2, FIG. 2(b):—The etched wafer 100 from step 1 is plated with a dielectric layer, followed by a barrier metal layer over the dielectric layer, and followed by a seed layer over the barrier metal layer. The dielectric layer is usually silicon dioxide. The barrier metal layer may be titanium, titanium nitride or tantalum silicon nitride. The seed layer may be copper or any other metal. For ease of illustration, the dielectric layer, the barrier metal layer and the seed layer are collectively given the numeral 120 in the drawings.

"Via Filling" step 3, FIG. 2(c):—The wafer 100 from step 2 is further plated with a metallic material 130 to fill the vias 110 with the metallic material 130 and hence form through silicon interconnects 140. Accordingly, the end portions 110a of the vias 110 will now be referred to as end portions 140a of the through silicon interconnects 140. The metallic material may, for example, be copper, tungsten or polysilicon.

"Front Side Polishing" step 4, FIG. 2(d): The wafers 100 from step 3 may undergo a polishing process such as chemical mechanical polishing to remove any residual metallic material 130 (e.g., copper) on the front side 100a of the wafer 100 where the vias 110 are formed.

"Front Side Metallization/Passivation" step 5, FIG. 2(e):— Front side metallization and passivation are carried out on the wafers 100 from step 4. As used herein, "front side" refers to the surface of the wafer 100 where the vias 110 are formed and the "back side" refers to the opposite surface of the wafer 100. The metallization process involves patterning metal traces and bond pads (not shown) on top or front side 100a of the wafer 100 and the through silicon interconnects 140. The metallic layer used in patterning the metal traces and bond pads may be copper, aluminum or other metals. The passivation process coats areas on the front side of the wafer, which are not covered by the metallization layer, with a passivation layer such as silicon nitride, silicon dioxide, polyimide, benzocyclobutene (BCB) or a photosensitive epoxy resin (trade names: "WPR-1020", "WPR-1050" or "WPR-1201", products of JSR Micro, Inc.). For ease of illustration, the front side metallization and passivation layers are collectively given the numeral 150 in the drawings.

"Chip-to-Wafer Attachment" step 6, FIG. 2(f):—One or more semiconductor chips 160, each provided with a pattern of conductive bumps 170 such as solder bumps, are positioned over the front surface 100a of the wafer 100 such that the conductive bumps 170 of the semiconductor chips 160 are aligned and are in contact with the through silicon interconnects 140 of the wafer 100. The one or more semiconductor chips 160 may be obtained by dicing a bumped wafer (not shown). The conductive bumps 170 of the semiconductor chips 160 are then reflowed to result in attachment of the chips 160 to the wafer 100.

"Under-filling" step 7, FIG. 2(g):—The gaps between the chips 160, the conductive bumps 170 and the front side 100a of the wafer 100 are under-filled with an under-fill material 180 such as an epoxy resin or other materials such as polymer-based encapsulation materials.

"Wafer Level Molding" step 8, FIG. 2(h):—The wafer 100 and the chips 160 are covered with molding material 190 such as an epoxy resin or polymer-based encapsulation material.

"Wafer Thinning" step 9, FIG. 2(i):—The molded wafer 100 from step (8) is ground and polished at its backside 100b to expose end portions 140a of the through silicon interconnects 140.

"Back Side Metallization/Passivation" step 10, FIG. 2(j):—Back side metallization and passivation are carried out on the thinned wafers 100 from step 9. The metallization process patterns metal traces and bond pads over the back side 100b of the wafer and end portions 140a of the through silicon interconnects 140. The metallic layer used in patterning the metal traces may be copper, aluminum or other metals. The passivation process coats areas on the back side of the wafer, which are not covered by the metallization layer, with a passivation layer such as silicon nitride, silicon dioxide, polyimide, benzocyclobutene (BCB) or a photosensitive epoxy resin (trade names: "WPR-1020", "WPR-1050" or "WPR-1201", products of JSR Micro, Inc.). For ease of illustration, the backside metallization and the passivation layers are referred to collectively by the numeral 200 in the drawings.

"Under bump metallization" step 11, FIG. 2(k):—Under bump metallization (UBM) pads 210 are formed on selected areas of the metallized portions of the wafer 100 from step 10. The selected areas may be locations for mounting conductive bumps in subsequent step 12. The UBM pads 210 may be made of Al/Ni/Au, Al/Ni—V/Cu, Cu/Ni/Au, Cu/Ni/Pd, Cu/Cr/Al, Ti—W/Cu/Ni(EP)/Cu(EP), Cr/Cu/Cu(EP)/Ni (EP), Ti/Ni(EP) or Ti/Ai/Ti/NiV.

"Wafer Bumping" step 12, FIG. 2(l):—The UBM pads 210 at the back side 100b of the wafer 100 are provided with conductive bumps 220 such as solder interconnects. Other non-solder interconnects include but are not limited to Copper pillars, Gold studs, etc.

"Singulation" step 13, FIG. 2(m):—The bumped wafer and chip structure from step 12 is singulated into individual units 230, each unit comprising one chip and one singulated wafer. Alternatively, the singulation may be such that the individual units comprise more than one chip and singulated wafer.

"Chip-to-Substrate Attachment and Under-filling or Over-molding" step 14, FIG. 2(n)(i) and FIG. 2(n)(ii):—The singulated units 230 are attached to a substrate 240 by reflowing the solder interconnects 220 at the backside 100b of the wafer 100. The mounted units 230 are either under-filled [FIG. 2(n)(ii)] or over-molded [FIG. 2(n)(i)] with a molding material 250 such as an epoxy resin or polymer-based encapsulation material. The substrate 240 may be an organic/laminate substrate.

"Solder Ball Mounting and Singulation" step 15, FIG. 2(o)(i) and FIG. 2(o)(ii):—The underside of the substrate 240 is provided with external electrical connections 260 such as solder balls. The entire assembly is then singulated to form individual semiconductor packages which are shown in FIGS. 3(a) or 3(b).

FIG. 3(a) shows a semiconductor package 300 resulting from steps 1 to 15. The semiconductor package 300 comprises the singulated unit 230 from step 13 which is attached to the substrate 240. The unit 230 is over-molded with the molding material 250 in step 14.

FIG. 3(b) shows an alternate semiconductor package 400 resulting from steps 1 to 15. The alternate semiconductor package 400 comprises the singulated unit 230 from step 13 attached to the substrate 240. The unit 230 is under-filled with the molding material 250 in step 14.

Figure 1C:
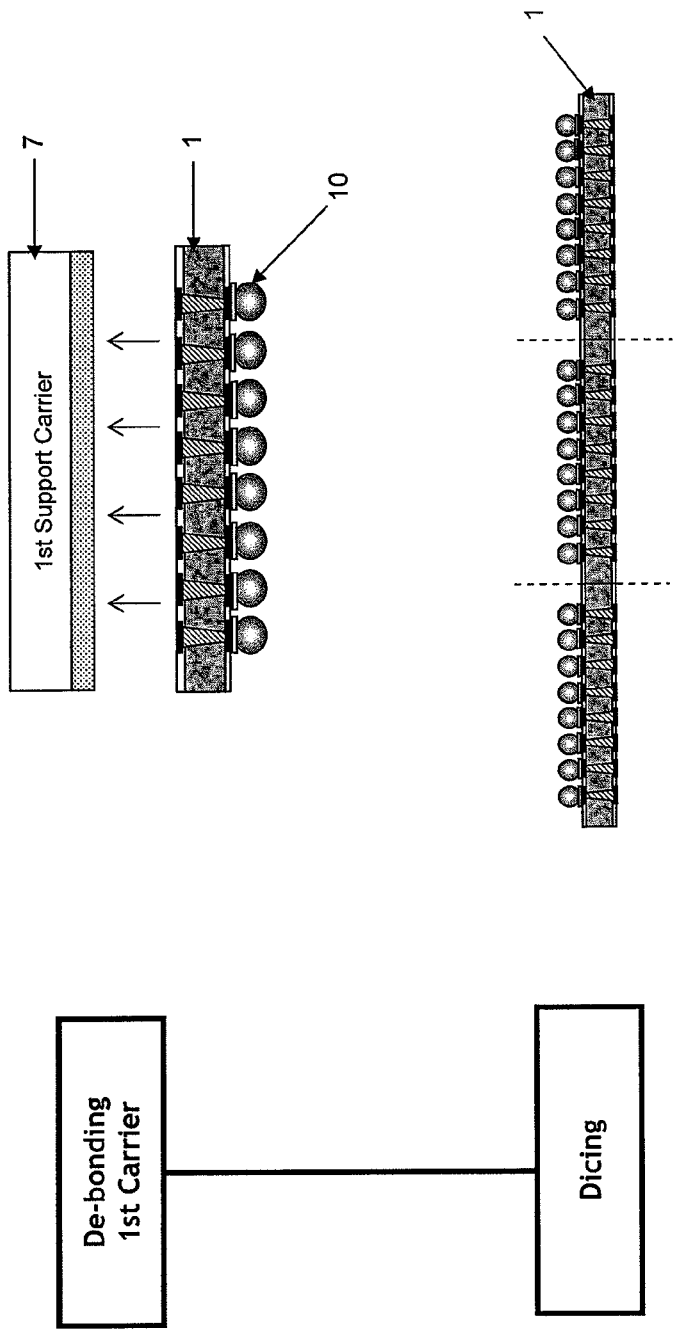
FIG. 1(c)(i) and 1(c)(ii) illustrate an alternate known process of stacking flip chips onto the thinned wafer with UBM pads and solder bumps from FIG. 1(a).
Figure 1D:
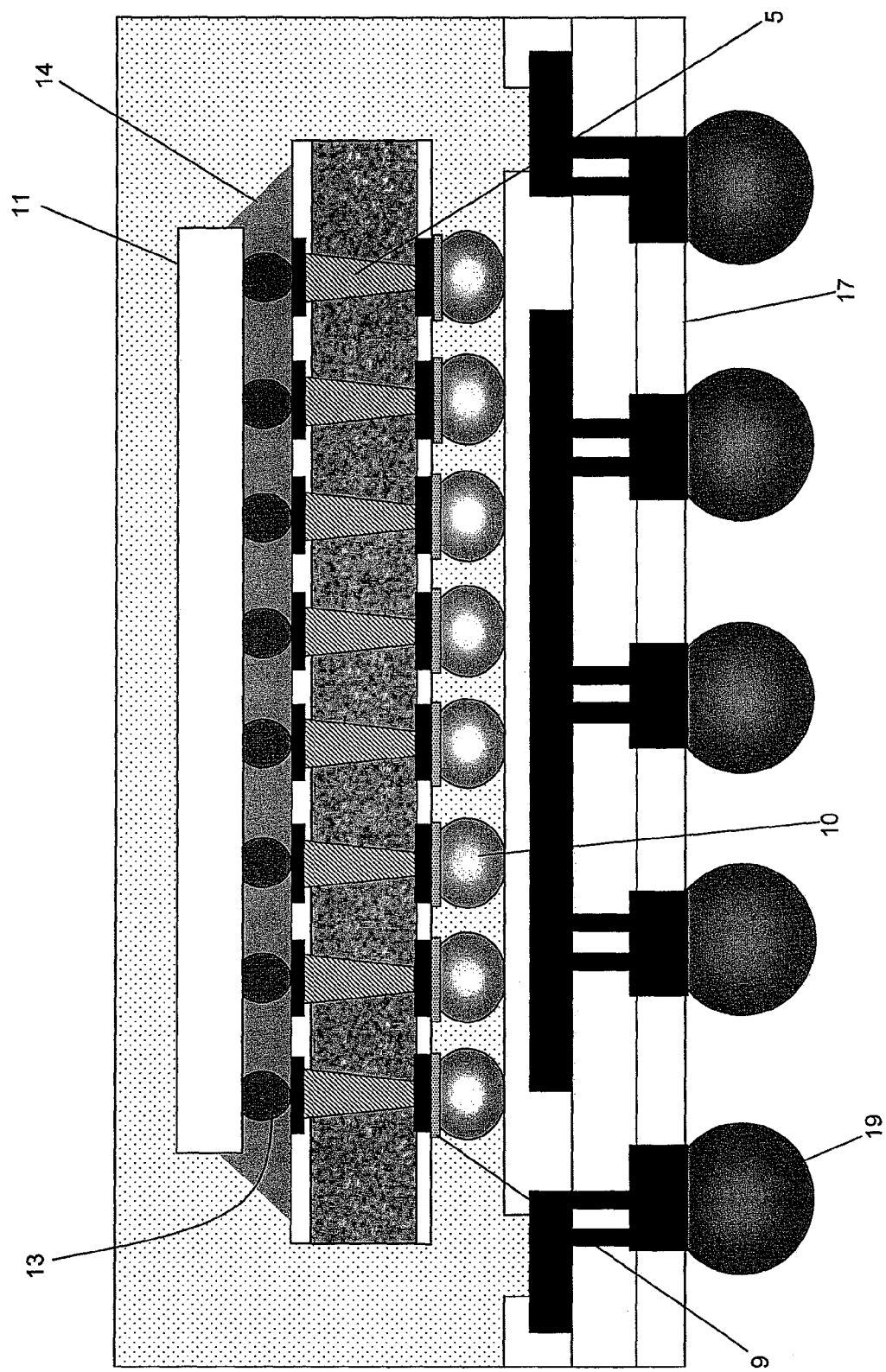
FIG. 1(d) illustrates a known semiconductor package resulting from the processes described by FIGS. 1(a) and 1(b), or by FIGS. 1(a) and 1(c).

Unlike the package structure resulting from known processes as shown in FIG. 1(c), the packages 300, 400 as shown in FIGS. 3(a) and 3(b) resulting from the processes of the present embodiment have a molded package (the singulated unit 230) within the packages 300, 400. This is a result of the "Wafer Level Molding" step 8 [FIG. 2(h)] which advantageously protects and supports the wafer 100 and the flip chips 160 stacked thereon, during subsequent steps 9 to 13, for example, "Wafer Thinning" step 9 and "Singulation" step 13. Also, prior to step 9, the un-thinned wafer provides structural support for the through silicon interconnect formation, chip to wafer attachment and molding (i.e., steps 1 to 8).

Stacked Package Having Three or More Dies

Whilst the description for the first embodiment above describes a process of making a two-stacked die package, it will be appreciated that the process may be extended to a package of three, four or more stacked dies.

For the stacked packages with three or more dies, intermediate dies with through silicon interconnects may be inserted between the top flip chip and the bottom wafer. An exemplary process of forming the intermediate die with through silicon interconnects is described below with reference to FIGS. 4(a) to 4(j).

"Wafer Etching" step 1, FIG. 4(a):—A wafer 300 is etched to create one or more vias 310 in the wafer 300. The etching can be achieved by patterning a mask (not shown) onto a front side 300a of the wafer 300. The mask exposes areas of the front side 300a of the wafer 300 where the vias 310 are to be formed and covers the remaining areas. Etching, for example, deep reactive-ion etching (DRIE), is then performed to form the vias 310 in the wafer 300. The mask is removed after the etching is completed. Other etching techniques include but are not limited to laser drilling. The vias 310 extend from the front surface 300a of the wafer 100 toward a rear surface 300b such that their end portions 310a reside partially in the wafer 300.

"Dielectric, Barrier & Seed Deposition" step 2, FIG. 4(b):—The etched wafer 300 from step 1 is plated with a dielectric layer, followed by a barrier metal layer over the dielectric layer, and followed by a seed layer over the barrier metal layer. The dielectric layer is usually silicon dioxide. The barrier metal layer may be titanium, titanium nitride or tantalum silicon nitride. The seed layer may be copper or any other metal. For ease of illustration, the dielectric layer, the barrier metal layer and the seed layer are collectively given the numeral 320 in the drawings.

"Via Filling" step 3, FIG. 4(c):—The wafer 300 from step 2 is further plated with a metallic material 330 to fill the vias 310 with the metallic material 330 and hence form through silicon interconnects 340. Accordingly, the end portions 310a of the vias 310 will now be referred to as end portions 340a of the through silicon interconnects 340. The metallic material may, for example, be copper, tungsten or polysilicon.

"Front Side Polishing" step 4, FIG. 4(d):—The wafers 300 from step 3 may undergo a polishing process such as chemical mechanical polishing to remove any residual metallic material 330 (e.g., copper) on the front side 300a of the wafer 300 where the vias 310 are formed.

"Front Side Metallization/Passivation" step 5, FIG. 4(e):—Front side metallization and passivation are carried out on the wafers 300 from step 4. As used herein, "front side" refers to the surface of the wafer 300 where the vias 310 are formed and the "back side" refers to the opposite surface of the wafer 300. The metallization process involves patterning metal traces and bond pads (not shown) on top of the front side 300a of the wafer 300 and the through silicon interconnects 340. The metallic layer used in patterning the metal traces and bond pads may be copper, aluminum or other metals. The passivation process coats areas on the front side of the wafer, which are not covered by the metallization layer, with a passivation layer such as silicon nitride, silicon dioxide, polyimide, benzocyclobutene (BCB) or a photosensitive epoxy resin (trade names: "WPR-1020", "WPR-1050" or "WPR-1201", products of JSR Micro, Inc.). For ease of illustration, the front side metallization and passivation layers are collectively referred to by the numeral 350 in the drawings.

"Wafer Thinning" step 6, FIG. 4(f):—The wafer 300 from step (6) is ground and polished at its backside 300b to expose end portions 340a of the through silicon interconnects 340.

"Back Side Metallization/Passivation" step 7, FIG. 4(g):—Back side metallization and passivation are carried out on the thinned wafers 300 from step 6. The metallization process patterns metal traces and bond pads over the back side 300b of the wafer and end portions 340a of the through silicon interconnects 340. The metallic layer used in patterning the metal traces may be copper, aluminum or other metals. The passivation process coats areas on the back side of the wafer, which are not covered by the metallization layer, with a passivation layer such as silicon nitride, silicon dioxide, polyimide, benzocyclobutene (BCB) or a photosensitive epoxy resin (trade names: "WPR-1020", "WPR-1050" or "WPR-1201", products of JSR Micro, Inc.). For ease of illustration, the backside metallization and the passivation layers are given the numeral 400 in the drawings.

"Under bump metallization" step 8, FIG. 4(h):—Under bump metallization (UBM) pads 410 are formed on selected areas of the metallized portions of the wafer 300 from step 7. The selected areas may form locations for conductive bumps in subsequent wafer bumping step 9. The UBM pads 410 may be made of Al/Ni/Au, Al/Ni—V/Cu, Cu/Ni/Au, Cu/Ni/Pd, Cu/Cr/Al, Ti—W/Cu/Ni(EP)/Cu(EP), Cr/Cu/Cu(EP)/Ni(EP), Ti/Ni(EP) or Ti/Ai/Ti/NiV.

"Wafer Bumping" step 9, FIG. 4(i):—The UBM pads 410 at the back side 300b of the wafer 300 are provided with conductive bumps 420 such as solder interconnects. Other non-solder interconnects include but are not limited to copper pillars, gold studs, etc.

"Singulation" step 10, FIG. 4(j):—The bumped wafer and chip structure from step 9 is singulated into individual units or dies 430.

It may be necessary to use a temporary bonded support carrier attached to the front surface 300a to structurally support the thinned intermediate wafer during steps 6 to 9.

To form the semiconductor package with three or more stacked dies, the same process steps 1 to 5 as shown in FIGS. 2(a) to 2(e) are performed. FIGS. 5(a) to 5(j) show subsequent steps 6 to 15, respectively, which will be described below.

"Chip-to-Wafer Attachment" step 6, FIG. 5(a):—The resulting intermediate dies 430 may be stacked on the 1st wafer 300 such that the conductive bumps 420 are aligned with the through silicon interconnects 340 of the 1st wafer 300. The 1st wafer 300 may be an active wafer or an inactive wafer. If desired, further intermediate dies may be stacked on top the intermediate die 430 in the same manner. For ease of illustration and description, the description and drawings would show the steps for forming a three die stacked package. Semiconductor chips 360, each provided with a pattern of conductive bumps 370 such as solder bumps, are positioned over the intermediate dies 430 such that the conductive bumps 370 of the semiconductor chips 360 are aligned and are in contact with the through silicon interconnects 340 of the intermediate dies 430. The semiconductor chips 360 may be obtained by dicing a bumped wafer (not shown). The conductive bumps 370 of the semiconductor chips 360 are then reflowed to result in attachment of the chips 360 to the intermediate dies 430.

"Under-filling" step 7, FIG. 5(b):—The gaps between the chips 360 and the intermediate dies 430, and between the intermediate dies 430 and the 1st wafer may be under-filled with an under-fill material 380 such as an epoxy resin or other materials such as polymer-based encapsulation materials.

"Wafer Level Molding" step 8, FIG. 5(c):—The 1st wafer 300, the intermediate dies 430 and the chips 360 are covered with molding material 390 such as an epoxy resin or polymer-based encapsulation material.

"Wafer Thinning" step 9, FIG. 5(d):—The molded wafer 300 from step 8 is ground and polished at its backside 300b to expose end portions 340a of the through silicon interconnects 340.

"Back Side Metallization/Passivation" step 10, FIG. 5(e):—Back side metallization and passivation are carried out on the thinned wafers 300 from step 9. The metallization process patterns metal traces and bond pads over the back side 300b of the wafer and end portions 340a of the through silicon interconnects 340. The metallic layer used in patterning the metal traces may be copper, aluminum or other metals. The passivation process coats areas on the back side of the wafer, which are not covered by the metallization layer, with a passivation layer such as silicon nitride, silicon dioxide, polyimide, benzocyclobutene (BCB) or a photosensitive epoxy resin (trade names: "WPR-1020", "WPR-1050" or "WPR-1201", products of JSR Micro, Inc.). For ease of illustration, the backside metallization and the passivation layers are collectively given the numeral 400 in the drawings.

"Under bump metallization" step 11, FIG. 5(f):—Under bump metallization (UBM) pads 410 are formed on the metallized portions of the wafer 300 from step 10. The UBM pads 410 may be made of Al/Ni/Au, Al/Ni—V/Cu, Cu/Ni/Au, Cu/Ni/Pd, Cu/Cr/Al, Ti—W/Cu/Ni(EP)/Cu(EP), Cr/Cu/Cu(EP)/Ni(EP), Ti/Ni(EP) or Ti/Ai/Ti/NiV.

"Wafer Bumping" step 12, FIG. 5(g):—The UBM pads 410 at the back side 300b of the wafer 300 are provided with conductive bumps 420 such as solder interconnects. Other non-solder interconnects include but are not limited to Copper pillars, Gold studs, etc.

"Singulation" step 13, FIG. 5(h):—The bumped wafer and chip structure from step 12 is singulated into individual units 440.

"Chip-to-Substrate Attachment and Under-filling or Overmolding" step 14, FIG. 5(i):—The singulated units 440 are attached to a substrate 450 by reflowing the solder interconnects 420 at the backside 300b of the wafer 300. The mounted units 440 are over-molded with a molding material such as an epoxy resin or polymer-based encapsulation material. The substrate 450 may be an organic/laminate substrate. Whilst not shown in the drawings, it will be appreciated that the mounted units 440 may also be underfilled with the molding material such as in the case of FIG. 2(n)(ii).

Figure 6:
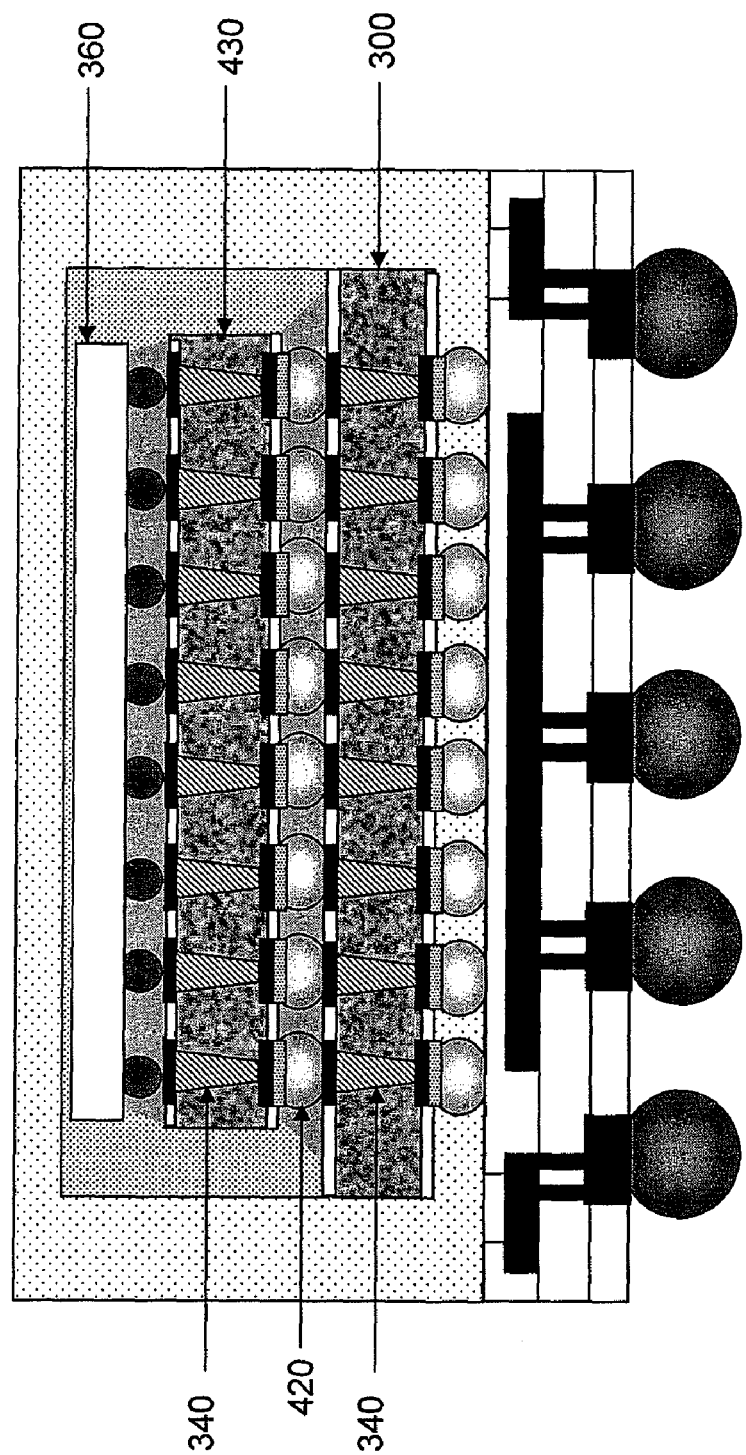
FIG. 6 show a semiconductor device according to a further exemplary embodiment of the invention.

"Solder Ball Mounting and Singulation" step 15, FIG. 5(j):—The underside of the substrate 450 is provided with external electrical connections 460 such as solder balls. The entire assembly is then singulated to form individual semiconductor packages which are shown in FIG. 6.

It will be appreciated that the intermediate dies may be stacked on the 1st wafer in wafer format, and need not be singulated into individual dies for stacking on the 1st wafer.

Semiconductor Package

There is provided a semiconductor package comprising one or more dies stacked in a vertical manner onto a substrate. FIGS. 3(a) and 3(b) show exemplary structures of the semiconductor package. While FIGS. 3(a) and 3(b) were previously described as having been derived from the process of the "Stacked Package Having Two Dies" embodiment, it will be appreciated that the present invention would also encompass packages of similar structures derived from processes other than those as described.

Referring to FIG. 3(a), the semiconductor package comprises a first die 100 and a second die 160. The first die 100 has a front side 100a and a back side 100b. The first die 100 may be an active die with embedded circuitry or an inactive die without any embedded circuitry. The first die 100 further includes a plurality of through silicon interconnects 140, each having an end portion 140a at the back side 100b of the first die 100 and a top portion 140b at the front side 100a of the first die 100. The through silicon interconnects 140 each has a dielectric layer formed along its internal walls, followed by a barrier metal layer formed over the dielectric layer, and then a seed layer formed over the barrier metal layer. The dielectric layer is usually silicon dioxide. The barrier metal layer may be Ti, TiN or tantalum silicon nitride. The seed layer may be copper or any other metal. For ease of illustration, the dielectric layer, the barrier metal layer and the seed layer are collectively referred the numeral 120 in the drawings. A metallic material 130 fills the space within the internal walls to form the through silicon interconnect 140. The metallic material may, for example, be copper, tungsten or polysilicon.

The front side 100a of the first die 100 has a metallization layer patterned thereon to create conductive traces and bond pads. The metallic layer may be copper, aluminum or other metals. A passivation layer is formed on the front side 100a on areas which are not occupied by the metallization layer. The passivation layer may be silicon nitride, silicon dioxide, polyimide, benzocyclobutene (BCB) or a photosensitive epoxy resin (trade names: "WPR-1020", "WPR-1050" or "WPR-1201", products of JSR Micro, Inc.). For ease of illustration, the front side metallization and passivation layers are collectively given the numeral 150 in the drawings.

The back side 100b of the first die 100 also has a metallization layer patterned thereon to create conductive traces and bond pads and a passivation layer occupying the remaining areas not deposited with the metallization layer. For ease of illustration, the backside metallization and the passivation layers are collectively given the numeral 200 in the drawings. The back side 100b further includes a plurality of UBM pads 210 formed on selected areas of the metallized portions. Conductive bumps 220 such as solder interconnects are formed on the UBM pads 210. Other non-solder interconnects includes but are not limited to Copper pillars, Gold studs, etc. The UBM pads 210 may be Al/Ni/Au, Al/Ni—V/Cu, Cu/Ni/Au, Cu/Ni/Pd, Cu/Cr/Al, Ti—W/Cu/Ni(EP)/Cu(EP), Cr/Cu/Cu(EP)/Ni(EP), Ti/Ni(EP) or Ti/Ai/Ti/NiV.

The second die 160 includes a front side 160a and a back side 160b, and further includes a plurality of conductive bumps 170 formed at the back side 160*b*. The second die 160 is stacked onto the first die 100 in a manner such that the conductive bumps 170 are aligned and are in contact with the through silicon interconnects 140. An under-filling material 180 fills the space between the second die 160, the conductive bumps 170 and the first die 100. The under-fill material 180 may be an epoxy resin or other materials such as polymer-based encapsulation materials. A mold material 190 also covers or encapsulates the second die 160 and the front side 100*a* of the first die 100. The mold material may be an epoxy resin or polymer-based encapsulation material.

The molded second die which is stacked on the first die, forms an internal package 500. The internal package 500 is mounted onto a substrate 240. The substrate 240 may be a laminate substrate or an organic substrate.

The semiconductor package further includes a mold material 250 which fully encapsulates the internal package 500 on the substrate 240 and a plurality of external electrical connections 260 such as solder ball formed on its underside.

Referring to FIG. 3(*b*), alternatively, the mold material 250 may only under-fill the space between the internal package 500 and the substrate 240.

It will be appreciated that the semiconductor package of the present invention would also extend to 3 or more dies stacked packages as shown by example in FIG. 6. Intermediate dies formed between the first die 300 and the second die 360 would also have through silicon interconnects 340 formed therein. Accordingly, for a three die stacked package, there will be one intermediate die 430 between the first die 300 and the second die 360, and the intermediate die is stacked in manner such that its through silicon interconnects 340 and conductive bumps 420 are aligned with the through silicon interconnects 340 of the first die 300 and the conductive bumps 370 of the second die 360.

One or more of the exemplary embodiments described above provide one or more of the following advantages:

No temporary bonded support carrier is required for the wafer in the 2-die stacked package assembly process or at least for the 1st wafer in the 3 or more die stacked package assembly process as will be clearly understood from the description above.

At least for the 2-die stacked package assembly process, given that there is no requirement for the support carrier, new process and material (e.g., adhesive) development required for bonding the temporary support carrier to the wafer need not be implemented.

Accordingly, at least for the 2-die stacked package assembly process, capital investment need not be put in place for new equipment to support temporary bonding support carrier technology.

Potential package cost advantage as the support carrier can be totally omitted for the 2 die stacked package and partially omitted for the 3 or more die stacked package.

As the process steps do not require additional bonding of the carrier substrate to the wafer or 1st wafer and the subsequent de-bonding therefrom, the face-to-back flip chip die stacking assembly flow cycle time may be improved.

As the fabrication of the through silicon interconnects in the wafer or 1st wafer is conducted and completed in the unground state, the process allows the wafer to have the flexibility of being solder bumped at a finer pitch with a higher bump I/O or being solder bumped with a pre-formed ball drop process, at a larger solder ball pitch and ball size.

As the wafer and the flip chips stacked thereon are molded [step 8, see FIG. 2(*h*)] prior to the wafer thinning step 9 and singulation step 13, the molding helps to support wafer during thinning and singulation.

While the present invention has been particularly shown and described with reference to exemplary embodiments thereof, it will be understood by those of ordinary skill in the art that various changes in form and details may be made therein without departing from the spirit and scope of the present invention as defined by the following claims.

What is claimed is:

1. A semiconductor package comprising:
   a substrate;
   a first die having a front side, a back side, and a plurality of through silicon interconnects, the first die being stacked onto the substrate; and
   a second die having a front side, a back side, and a first plurality of conductive bumps formed at the back side of the second die, the second die being stacked onto the first die and having under-filled the first plurality of conductive bumps such that the first plurality of conductive bumps electrically communicate with the through silicon interconnects;
   wherein a first mold material encapsulates the second die and the front side of the first die; and
   a second mold material encapsulates the first die, the second die, and a plurality of solder interconnects.

2. The semiconductor package of claim 1, wherein each of the through silicon interconnects further comprises:
   an end portion at the back side of the first die and a top portion at the front side of the first die;
   a dielectric layer formed along internal walls of the through silicon interconnect;
   a barrier metal layer formed over the dielectric layer;
   a seed layer formed over the barrier metal layer; and
   a metallic material filling space within the internal walls of the through silicon interconnect.

3. The semiconductor package of claim 2, further comprising:
   a metallic layer and a passivation layer formed on the front side of the first die so as to be non-overlapping;
   a metallic layer and a passivation layer formed on the back side of the first die so as to be non-overlapping;
   a plurality of under bump metallization (UBM) pads formed on the metallic layer on the back side of the first die; and
   a second plurality of conductive bumps formed on the UBM pads.

* * * * *